US005491378A

United States Patent [19]

Lee et al.

[11] Patent Number: 5,491,378

[45] Date of Patent: Feb. 13, 1996

[54] ELECTRO LUMINESCENCE DEVICE AND METHOD FOR FABRICATING THE SAME

[75] Inventors: Eun Y. Lee, Seoul; Hyoung K. Bae, Kyungki-Do, both of Rep. of Korea

[73] Assignee: Goldstar Co., Ltd., Rep. of Korea

[21] Appl. No.: 285,928

[22] Filed: Aug. 4, 1994

[30] Foreign Application Priority Data

Sep. 7, 1993 [KR] Rep. of Korea .................. 17923/1993
Oct. 30, 1993 [KR] Rep. of Korea .................. 22914/1993

[51] Int. Cl.$^{6}$ .................................................... H01L 31/12

[52] U.S. Cl. .......................... 313/506; 313/509; 313/512; 313/113; 428/917

[58] Field of Search .................................... 313/506, 509, 313/512, 113, 479, 239, 242; 315/169.3; 345/45, 76; 428/917

[56] References Cited

U.S. PATENT DOCUMENTS 3,368,099 2/1968 Arnold ................................ 313/509 X
4,767,679 8/1988 Kawachi ............................ 313/506 X
4,983,469 1/1991 Huzino et al. ...................... 313/506 X

*Primary Examiner*—Sandra L. O'Shea
*Assistant Examiner*—Ashok Patel
*Attorney, Agent, or Firm*—Ostrolenk, Faber, Gerb & Soffen

[57] ABSTRACT

An electro luminescence device includes a light shield element made of a metal layer and an insulation film. Both the metal layer and the insulation film extend along side surfaces of a luminescence layer and are adapted to reflect light emitted in a direction toward the side surfaces of the luminescence layer. Thereby, the amount of light emitted toward neighboring pixels is reduced, while the amount of light emitted by the display element is increased. The invention reduces cross-talk of light between neighboring pixels and thereby achieves an improvement in contrast for each pixel.

7 Claims, 6 Drawing Sheets

ELECTRO LUMINESCENCE DEVICE AND METHOD FOR FABRICATING THE SAME

BACKGROUND OF THE INVENTION

1. Field of the Invention

The present invention relates to an electro luminescence device, and more particularly to an electro luminescence device including a light shield element formed on side surfaces of its luminescence layer and adapted to shield light emitted in a direction toward the side surfaces of luminescence layer, thereby capable of obtaining improvements in luminance and contrast for each pixel thereof, and a method for fabricating the same.

2. Description of the Prior Art

Referring to FIG. 1, there is illustrated a conventional electro luminescence device. As shown in FIG. 1, the conventional electro luminescence device includes a substrate 1 and a lower electrode 2 formed on the substrate 1. Sequentially formed on the lower electrode 2 are a first insulation film 3, a luminescence layer 4 and a second insulation film 5. An upper electrode 6 is formed on the second insulation film 5.

Now, fabrication of the electro luminescence device having the above-mentioned structure will be described.

First, an indium tin oxide (ITO) layer is deposited over the substrate 1 comprised of, for example, a glass substrate. Over the ITO layer, a photoresist film is then coated. The photoresist film is then subjected to a patterning to form a predetermined pattern. Using the patterned photoresist film as a mask, the ITO layer is etched, thereby forming the lower electrode 2 made of ITO.

Thereafter, formation of the first insulation film 3 is carried out by depositing an insulation material such as $Ta_2O_5$ or $SiO_2$ over the lower electrode by use of a sputtering process.

The first insulation film 3 should exhibit a high dielectric constant, a high dielectric breakdown strength, a superior transmittance and a superior adhesiveness.

The luminescence layer 4 is then deposited over the first insulation film 3 using an electron-beam evaporation process or the sputtering process. As the luminescence layer 4, a layer of a Group II–VI semiconductor is mainly used. As such a layer, a Mn-doped ZnS layer is used in this case.

Accordingly, the luminescence layer 4 has a spectrum of the visible light range and a wide energy band gap and exhibits matched charge compensation and ion radius between the luminous basic body of ZnS and the luminous center body of $Mn^{2+}$.

Subsequently, the second insulation film 5 is deposited over the luminescence layer 4 using the sputtering process. Using the electron-beam evaporation process, an aluminum layer is then deposited over the second insulation film 5. In this case, the second insulation film 5 may be made of the same material as the first insulation film 3 or made of a material different from the first insulation film 3.

Then, a photoresist film is coated over the aluminum layer. The photoresist film is then subjected to a patterning to form a predetermined pattern. Using the patterned photoresist pattern as a mask, the aluminum layer is etched, thereby forming the upper electrode 6 comprised of the aluminum layer.

Thereafter, a photoresist film not shown is coated over the resulting structure and then subjected to a patterning to form a predetermined pattern, using a well-known photo-etching process. Using the patterned photoresist pattern not shown as a mask, the second insulation film 5, the luminescence layer 4 and the first insulation film 3 are sequentially etched so that a pad portion of the lower electrode 2 can be exposed.

In this case, the etching process used is the reactive ion etch (RIE) process which is a kind of dry etching process.

Operation of the conventional electro luminescence device fabricated in accordance with the above-mentioned method will now be described, in conjunction with FIG. 2.

As an AC voltage is applied between the lower electrode 2 and the upper electrode 6, charges being present at the interface between the first insulation film 3 and the luminescence layer 4 and the interface between the luminescence layer 4 and the second insulation film 5 tunnel into the conduction band of the luminescence layer 4. During the tunneling, the charges are accelerated by a high electric field generated in the luminescence layer 4, thereby generating hot electrons.

These accelerated hot electrons impact against the luminous center bodies of $Mn^{2+}$ doped in the luminous basic bodies of Zns of the luminescence layer 4, thereby ionizing the luminous center bodies. As the luminous center bodies ionize, they are excited. A part of hot electrons ionize the luminous bodies, so that they are coupled with holes. As a result, electron-hole pairs are formed.

On the other hand, the electrons excited up to the conduction band of the luminescence layer 4 fall down to the valence band of the luminescence layer 4. As a result, light is emitted from the luminescence layer 4. The emitted light has an energy corresponding to the energy difference between the conduction band and the valence band of the luminescence layer 4.

In the conventional electro luminescence device, only about 1/10 of the total light amount emitted from the luminescence layer 4 is emitted in a direction toward the lower electrode 2 which is the part used as a display element. The remaining part, namely, about 9/10 of the total light is emitted in directions other than in a direction toward the lower electrode 2. This will be described in detail.

As shown in FIG. 3, the luminescence layer 4 emits a larger amount of light toward side surfaces of a corresponding pixel than that emitted toward the upper surface of the lower electrode 2. As a result, where the light emitted from the luminescence layer 4 is a blue color light, this blue color light exhibits too low luminance to be practically employed in display elements.

Since the light from the luminescence layer 4 is emitted in a large amount in directions other than in direction toward the upper electrode 6, namely, toward a viewer, it affects other neighboring pixels. As a result, each pixel exhibits a degradation in contrast.

SUMMARY OF THE INVENTION

Therefore, an object of the invention is to provide an electro luminescence device capable of shielding light emitted in a direction toward side surfaces of its luminescence layer, while emitting a larger amount of light toward its display element, thereby exhibiting improvements in luminance and contrast for each pixel thereof, and a method for fabricating the same.

In accordance with one aspect, the present invention provides an electro luminescence device comprising: a substrate; a lower electrode formed on an upper surface of the substrate; a light shield element formed on a predetermined portion of the lower electrode and adapted to shield a light emitted toward side surfaces of a luminescence layer; a first insulation film formed on an upper surface portion of the lower electrode defined by the light shield element; the luminescence layer formed on an upper surface of the first insulation film; a second insulation film formed on an upper surface of the luminescence layer; and an upper electrode formed on an upper surface of the second insulation layer.

In accordance with another aspect, the present invention provides a method for fabricating an electro luminescence device, comprising the steps of: forming a lower electrode on a substrate, the lower electrode having a predetermined pattern including a recess and a light shield element adapted to shield a light emitted toward side surfaces of a luminescence layer of the electro luminescence device; forming a first insulation film over the lower electrode; forming the luminescence layer on a portion of the first insulation film disposed in the recess of the lower electrode; forming a second insulation film over the luminescence layer; and forming an upper electrode on the second insulation film.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
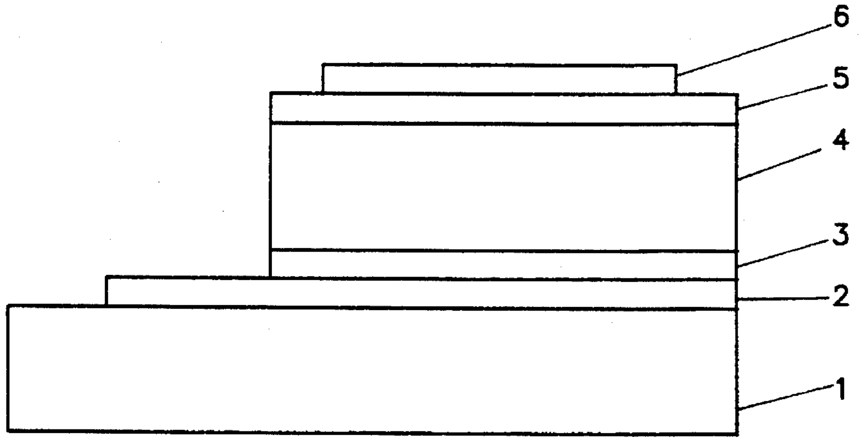
FIG. 1 CONVENTIONAL ART
FIG. 1 is a sectional view of a conventional electro luminescence device.
Figure 2:
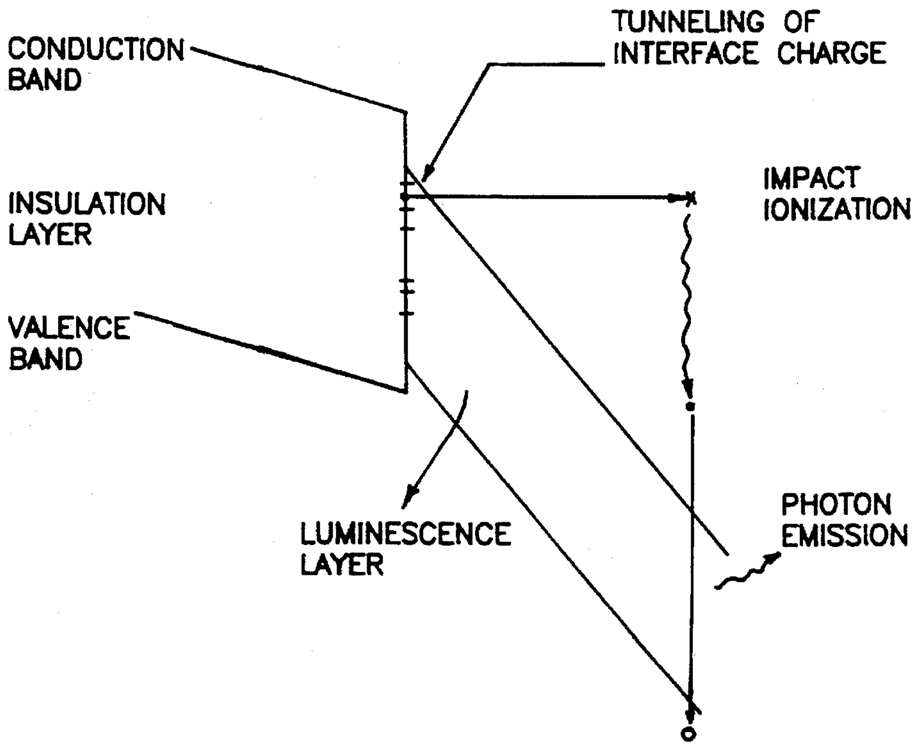
FIG. 2 CONVENTIONAL ART
FIG. 2 is a diagram illustrating energy bands of the electro luminescence device shown in FIG. 1.
Figure 3:
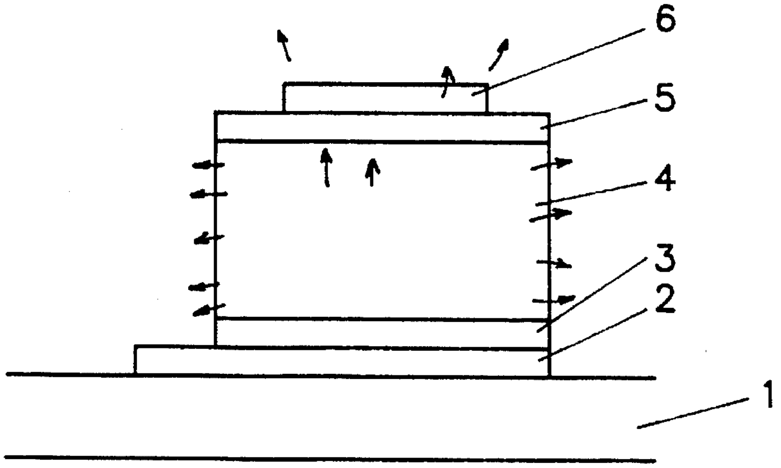
FIG. 3 CONVENTIONAL ART
FIG. 3 is a schematic view illustrating a light emitting condition of the electro luminescence device shown in FIG. 1.
Figure 4:
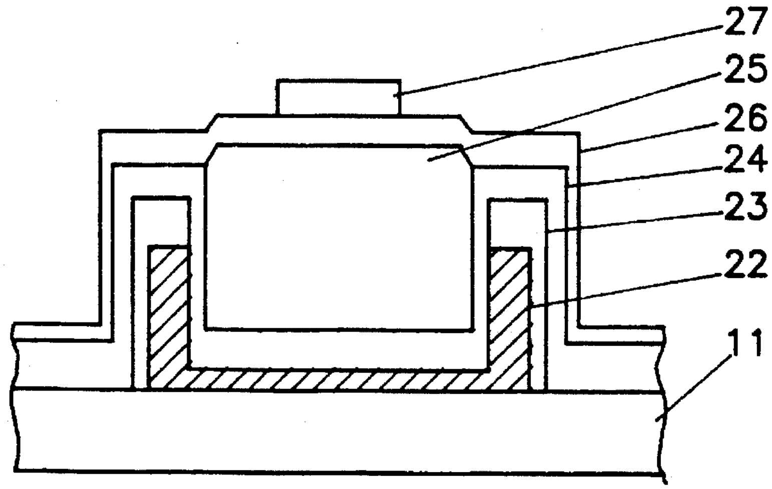
FIG. 4 is a sectional view of an electro luminescence device in accordance with an embodiment of the present invention.

Referring to FIG. 4, there is illustrated an electro luminescence device in accordance with an embodiment of the present invention.

As shown in FIG. 4, the electro luminescence device includes a substrate 11 and a lower electrode 22 formed on the substrate 11. The lower electrode 22 has a recess at the central portion of its upper surface and a protrusion formed along the peripheral edge of the upper surface. A first insulation film 23 is formed on the upper surface and outer side surface of the protrusion of lower electrode 22. A second insulation film 24 is also formed on the first insulation film 23 and the surface of the recess of lower electrode 22. The electro luminescence device further includes a luminescence layer 25 formed on a portion of the second insulation film 24 disposed on the surface of the recess, a third insulation film 26 formed on the luminescence layer 25 and the second insulation film 24, and an upper electrode 27 formed on a portion of the third insulation film disposed on the luminescence layer 25.

Fabrication of the electro luminescence device having the above-mentioned structure will now be described, in conjunction with FIGS. 5A to 5D.

Figure 5A:
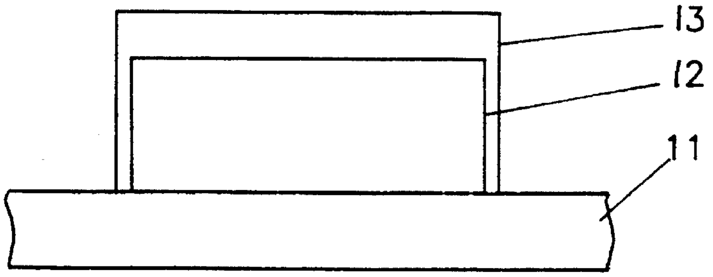
FIGS. 5A to 5D are sectional views respectively illustrating the electro luminescence device shown in FIG. 4.

First, an aluminum layer is deposited over the substrate 11 comprised of, for example, a glass substrate by use of the electron-beam evaporation process or the sputtering process. Over the aluminum layer, a photoresist film is then coated. The photoresist film is then subjected to a patterning to form a predetermined pattern. Using the patterned photoresist film as a mask, the aluminum layer is etched, thereby forming a predetermined aluminum layer pattern 12, as shown in FIG. 5A. Subsequently, an oxide film 13 made of $A1_2O_3$ is formed over the aluminum layer pattern 12 using a well-known anodic oxidation process.

Figure 5B:
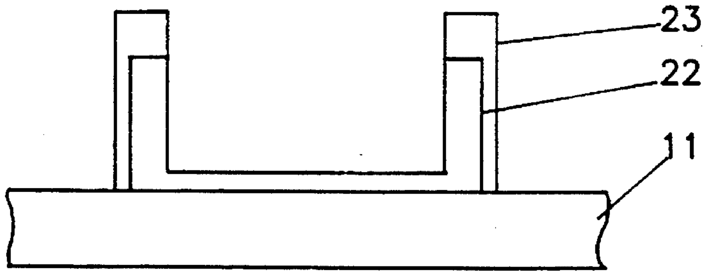

Thereafter, a patterned photoresist film is formed on the resulting structure except for the central region of the upper surface of oxide film 13 using the well-known photo-etching process. Using the patterned photoresist film as a mask, the oxide film 13 is then etched, thereby forming the first insulation film 23 comprised of the oxide film partially removed at the central portion of its upper surface, as shown in FIG. 5B. Subsequently, the aluminum layer pattern 12 is etched to a predetermined depth, thereby forming the lower electrode 22 comprised of the aluminum layer. The lower electrode 22 has a recess at its upper surface and a protrusion formed along the peripheral edge of the upper surface.

In this case, the first insulation film 23 and the lower electrode 22 are formed by etching the oxide film 13 and the aluminum layer pattern 12 by use of the RIE process which is a kind of dry etching.

Figure 5C:
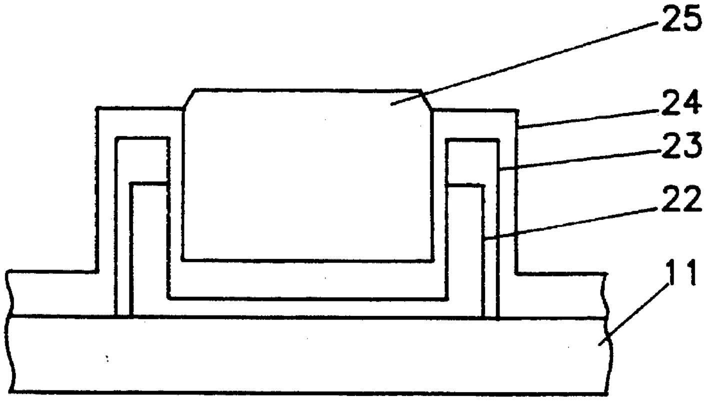
Figure 5D:
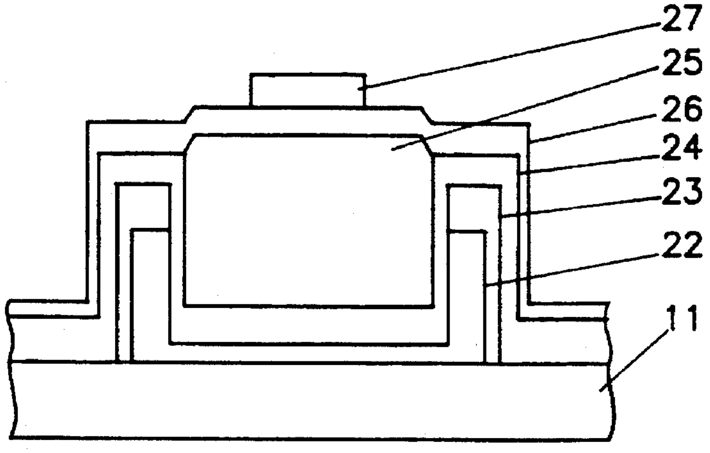
Figure 6:
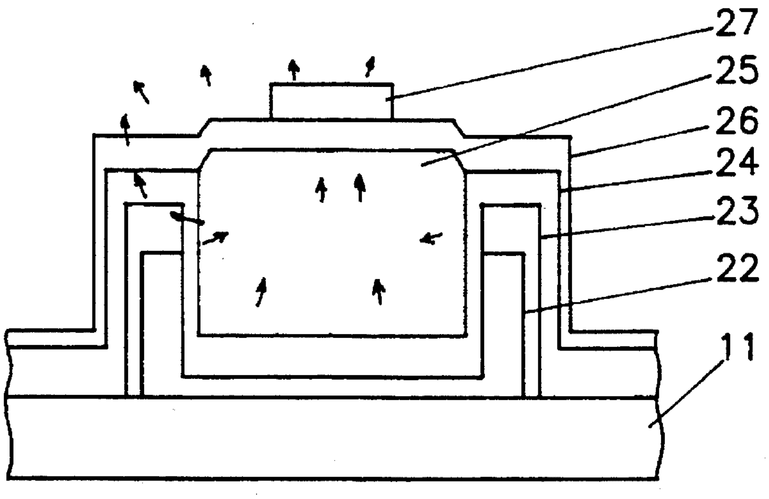
FIG. 6 is a schematic view illustrating a light emitting condition of the electro luminescence device shown in FIG. 4.

Thereafter, formation of the second insulation film 24 is carried out by depositing an insulation material such as $Ta_2O_5$ or $SiO_2$ over the entire surface of the resulting structure including the surface of the first insulation film 23 and the surface of the recess of lower electrode 22 by use of the sputtering process, as shown in FIG. 5C.

The second insulation film 24 should exhibit a high dielectric constant, a high dielectric breakdown strength, a superior transmittance and a superior adhesiveness.

A luminescence layer is then deposited over the second insulation film 24 using the electron-beam evaporation process or the sputtering process. As the luminescence layer, a layer of a Group II–VI semiconductor is mainly used. As such a layer, a Mn-doped ZnS layer is used in this case.

Accordingly, the luminescence layer 4 has a spectrum of the visible light range and a wide energy band gap and exhibits matched charge compensation and ion radius between the luminous basic body of ZnS and the luminous center body of $Mn^{2+}$.

The luminescence layer is then etched using the well-known photo-etching process, thereby forming the luminescence layer 25 on a portion of the second insulation film 24 disposed at the recess region of the lower electrode 22.

Subsequently, the third insulation film 26 is deposited over the luminescence layer 25 and the second insulation film 24 using the electron beam evaporation process or the sputtering process. In this case, the third insulation film 26 may be made of the same material as the second insulation film 24 or made of a material different from the second insulation film 24.

A transparent ITO layer is then deposited over the third insulation layer 26 using the electron-beam evaporation process or the sputtering process. Thereafter, the transparent ITO layer is etched using the well-known photo-etching process, thereby forming the upper electrode 27 comprised of the ITO layer and disposed on a portion of the third insulation film 26 disposed on the luminescence layer 25.

The electro luminescence device fabricated in accordance with the method of the present invention operates in a similar manner to the conventional electro luminescence device.

In the electro luminescence device of the present invention, however, light generated from the luminescence layer 25 when an AC voltage is applied between the lower electrode 22 and the upper electrode 27 is spread in all directions. Among the light emitted from the luminescence layer 25, the light emitted toward the side surfaces of the pixel is shielded by the protrusion formed along the peripheral edge of the upper surface of lower electrode 22 and by the first insulation film 23. As a result, the shielded light goes toward the upper electrode 27.

Figure 7:
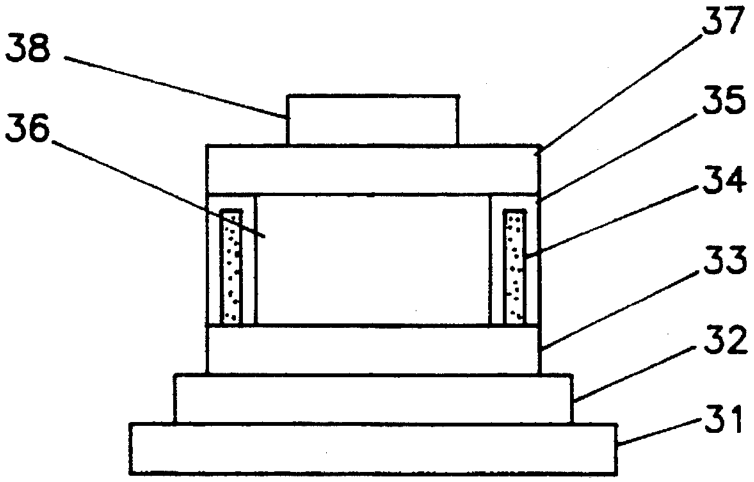
FIG. 7 is a sectional view of an electro luminescence device in accordance with another embodiment of the present invention.

Referring to FIG. 7, there is illustrated an electro luminescence device in accordance with another embodiment of the present invention.

As shown in FIG. 7, the electro luminescence device includes a substrate 31, a lower electrode 32 formed on the substrate 31, a first insulation film 33 formed on the lower electrode 32, and a metal layer 34 formed on the peripheral edge region of the upper surface of the first insulation film 33. The electro luminescence device further includes a second insulation film 35 formed over the metal layer 34, a luminescence layer 36 formed on a portion of the upper surface of the first insulation film 33 defined by the second insulation film 35, a third insulation film 37 formed on the luminescence layer 36 and the second insulation film 35, and an upper electrode 38 formed on a portion of the third insulation film disposed on the luminescence layer 36.

Figure 8A:
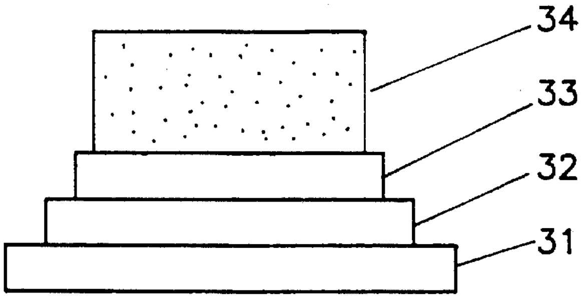
FIGS. 8A to 8C are sectional views respectively illustrating the electro luminescence device shown in FIG. 7.
Figure 8B:
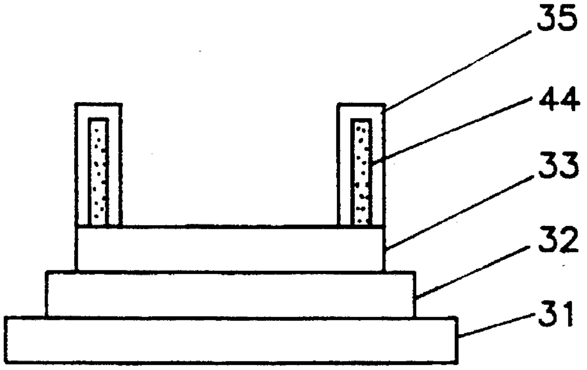

Now, fabrication of the electro luminescence device having the above-mentioned structure will be described, in conjunction with FIGS. 8A to 8C.

First, an ITO layer is deposited over the substrate 31 comprised of, for example, a glass substrate by use of the electron-beam evaporation process or the sputtering process. The ITO layer is subjected to a patterning using the well-known photo-etching process, thereby forming the lower electrode 32 comprised of the patterned ITO layer, as shown in FIG. 8A. Thereafter, an insulation material such as $Ta_2O_5$ or $SiO_2$ is deposited over the lower electrode 32 using the sputtering process. The insulation film is then subjected to a patterning using the well-known photo-etching process, thereby forming the first insulation film 33 comprised of the patterned insulation film of $Ta_2O_5$ or $SiO_2$.

The first insulation film 33 should exhibit a high dielectric constant, a high dielectric breakdown strength, a superior transmittance and a superior adhesiveness.

Subsequently, formation of the metal layer 34 is carried out by depositing an aluminum layer over the first insulation film 33 to a thickness corresponding to that of the luminescence layer 36 to be subsequently formed, by use of the electron-beam evaporation process. As shown in FIG. 8B, the aluminum layer is etched at its central portion corresponding to the region where the luminescence layer 36 is to be formed, by use of the well-known photo-etching process. As a result, the aluminum layer remains only on the peripheral edge region of the upper surface of the first insulation film 33. The remaining aluminum layer constitutes the metal layer 34. Thereafter, formation of the second insulation film 35 is carried out by forming an oxide film of A120$_j$over the metal layer 34 by use of the well-known anodic oxidation process. Where the metal layer 34 is not made of aluminum, the second insulation film 35 may be formed using other processes than the anodic oxidation process.

Figure 8C:
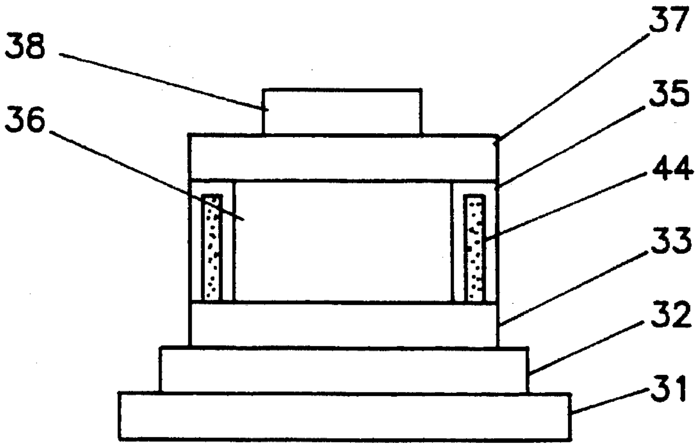

A luminescence layer is then deposited over the first insulation film 33 and the second insulation film 35 using the electron-beam evaporation process or the sputtering process, as shown in FIG. 8C. Using the well-known photo-etching process, the luminescence layer is then etched such that it remains only at its portion corresponding to the pixel region, namely, its portion disposed on the upper surface portion of the first insulation film 33 defined by the metal layer 34. The remaining luminescence layer constitutes the luminescence layer 36.

Subsequently, an insulation material for the third insulation film 37 is deposited over the resulting structure including the luminescence layer 36 and the second insulation film 35 using the sputtering process. In this case, the insulation material may be the same as that of the second insulation film 35 or different from that of the second insulation film 35. The insulation film is then etched using the well-known photo-etching process, thereby forming the third insulation film 37 disposed on the luminescence layer 36 and the second insulation film 35.

A transparent ITO layer is then deposited over the third insulation layer 37 using the electron-beam evaporation process or the sputtering process. Thereafter, the transparent ITO layer is etched using the well-known photo-etching process, thereby forming the upper electrode 38 comprised of the ITO layer and disposed on a portion of the third insulation film 37 disposed on the luminescence layer 36.

The electro luminescence device fabricated in accordance with the method of the present invention operates in a similar manner to the conventional electro luminescence device.

Figure 9:
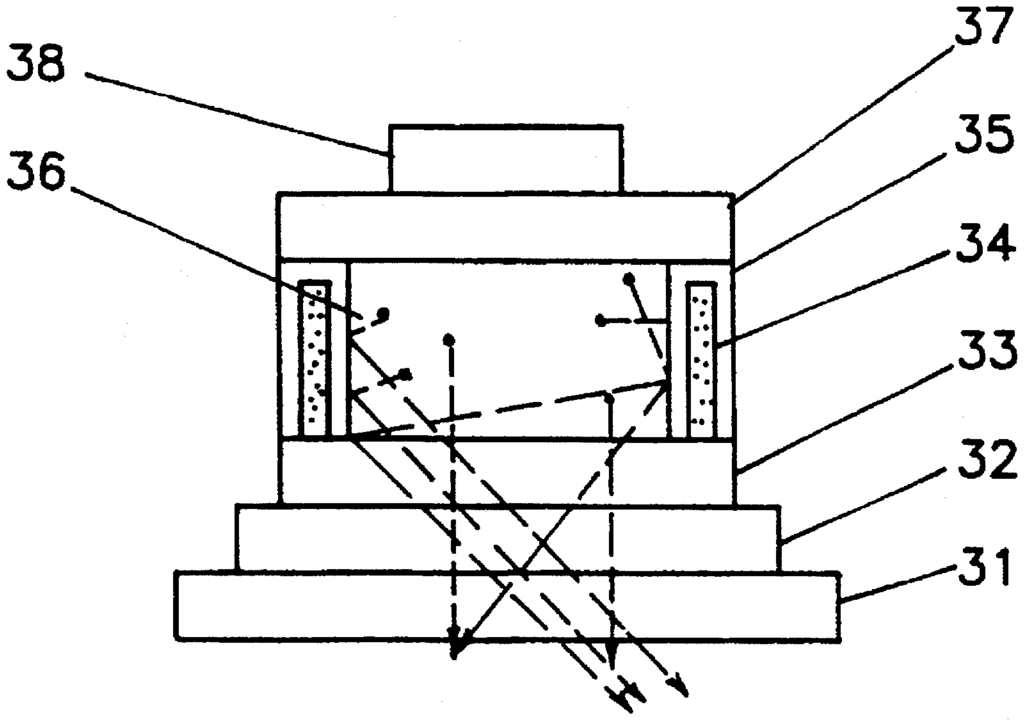
FIG. 9 is a schematic view illustrating a light emitting condition of the electro luminescence device shown in FIG. 7.

In the electro luminescence device of the present invention, however, light generated from the luminescence layer 36 when an AC voltage is applied between the lower electrode 32 and the upper electrode 38 is spread in all directions. Among the light emitted from the luminescence layer 36, the light emitted toward the side surfaces of the pixel is shielded by the metal layer 34 formed along the peripheral edge of the upper surface of the first insulation film 33 and by the second insulation film 35, as shown in FIG. 9. As a result, the shielded light goes toward the upper electrode 38.

As apparent from the above description, the present invention provides an electro luminescence device including a light shield element formed on side surfaces of its luminescence layer and adapted to shield light emitted in a direction toward the side surfaces of luminescence layer, thereby enabling obtaining improvements in luminance and contrast for each pixel thereof.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An electro luminescence device comprising:

a substrate;

a lower electrode formed on an upper surface of the substrate;

a light shield element formed on a predetermined portion of the lower electrode;

an insulation film formed above the light shield element and the lower electrode;

a luminescence layer formed on an upper surface of the insulation film;

a further insulation film formed on an upper surface of the luminescence layer;

an upper electrode formed on an upper surface of the further insulation layer;

said light shield element being fabricated of a material and being disposed to reflect light toward side surfaces of said luminescence layer; and wherein the lower electrode has a recess at a central portion thereof and a protrusion formed along a peripheral edge, the light shield element including the protrusion.

2. An electro luminescence device in accordance with claim 1, wherein the light shield element is formed around the luminescence layer.

3. An electro luminescence device in accordance with claim 1, wherein the light shield element comprises the protrusion which extends upwards from the lower electrode.

4. An electro luminescence device in accordance with claim 1, wherein the light shield element comprises the protrusion extending upwards from the lower electrode and an additional insulation film formed on the protrusion.

5. An electro luminescence device in accordance with claim 4, wherein the additional insulation film is formed on an outer side surface and an upper surface of the protrusion of the lower electrode.

6. An electro luminescence device comprising:

a substrate;

a lower electrode formed on said substrate;

a first insulation film formed on said lower electrode;

a luminescence layer formed on said first insulation film;

a metal layer formed on a peripheral edge region of an upper surface of the first insulation film;

a second insulation film is formed on surfaces of the metal layer;

a light shield element formed on the first insulation film, said light shield element being juxtaposed to side surfaces of said luminescence layer, the light shield element including said metal layer and said second insulation film;

a third insulation film formed on an upper surface of the luminescence layer; and an upper electrode formed on an upper surface of said third insulation layer.

7. An electro luminescence device comprising:

a substrate;

a lower electrode with a protrusion formed along a peripheral edge of an upper surface thereof;

a first insulation film formed on an outside of said protrusion of said lower electrode;

a light shield element including the protrusion of the lower electrode and said first insulation film;

a second insulation film formed on said light shield element and the lower electrode;

a luminescence layer formed on said second insulation film so that the light shield element is positioned only along a side surface of the luminescence layer;

a third insulation film formed on the second insulation film and the luminescence layer; and an upper electrode formed on said third insulation film.

* * * * *